(12) United States Patent
Dress et al.

(10) Patent No.: US 6,858,088 B1
(45) Date of Patent: Feb. 22, 2005

(54) METHOD AND APPARATUS FOR TREATING SUBSTRATES

(75) Inventors: Peter Dress, Bruchsal (DE); Karl Appich, Diefenbach (DE); Peter Krauss, Sternenfeis (DE); Jakob Szekeresch, Schönberg (DE); Robert Weihing, Mühlacker (DE)

(73) Assignee: Steag Hama Tech AG, Sternenfels (DE)

(*) Notice: Subject to any disclaimer, the term of this patent is extended or adjusted under 35 U.S.C. 154(b) by 0 days.

(21) Appl. No.: 09/913,986
(22) PCT Filed: Jan. 19, 2000
(86) PCT No.: PCT/EP00/00380
§ 371 (c)(1),
(2), (4) Date: Aug. 16, 2001
(87) PCT Pub. No.: WO00/48744
PCT Pub. Date: Aug. 24, 2000

(30) Foreign Application Priority Data

Feb. 16, 1999  (DE) .......................................... 199 06 398

(51) Int. Cl.⁷ ............................ C23C 16/00; C23F 1/00; H01L 21/306
(52) U.S. Cl. ............................ 118/731; 118/50; 118/52; 118/54; 118/728; 118/729; 118/733; 156/345.23; 156/345.55
(58) Field of Search ................. 156/345.23, 345.55; 204/298.15, 298.23, 298.28; 118/733, 728, 730, 731, 50, 501, 729

(56) References Cited

U.S. PATENT DOCUMENTS

| | | | | |
|---|---|---|---|---|
| 4,476,162 A | * | 10/1984 | Ireland | 427/164 |
| 4,503,807 A | * | 3/1985 | Nakayama et al. | 118/719 |
| 4,655,162 A | * | 4/1987 | Kameyama | 118/50 |
| 4,851,263 A | * | 7/1989 | Ishii et al. | 427/240 |
| 5,042,421 A | | 8/1991 | Anbe | |
| 5,188,501 A | * | 2/1993 | Tomita et al. | 414/416.08 |
| 5,445,677 A | | 8/1995 | Kawata et al. | |
| 5,452,905 A | * | 9/1995 | Bohmer et al. | 279/3 |
| 5,643,366 A | * | 7/1997 | Somekh et al. | 118/729 |
| 5,650,196 A | | 7/1997 | Muhlfriedel et al. | |
| 5,656,082 A | * | 8/1997 | Takatsuki et al. | 118/52 |
| 5,879,457 A | * | 3/1999 | Sahoda et al. | 118/319 |
| 5,906,860 A | * | 5/1999 | Motoda et al. | 427/240 |

(List continued on next page.)

FOREIGN PATENT DOCUMENTS

| | | |
|---|---|---|
| DE | 4024642 C2 | 2/1992 |
| DE | 9218974 U1 | 10/1996 |
| DE | 19545573 A1 | 6/1997 |
| EP | 0711108 B1 | 8/1993 |
| JP | 59208832 | 11/1984 |
| JP | 3056163 | 3/1997 |
| JP | 9253561 | 9/1997 |
| JP | 10092713 | 4/1998 |

OTHER PUBLICATIONS

Patent Abstract of Japan, No. 04146615 dated May 20, 1992.
Patent Abstract of Japan, No. 56070634 dated Jun. 12, 1981.
Patent Abstract of Japan, No. 05084460 dated Apr. 6, 1993.
IBM "Upside–Down Resist Coating of Semiconductor Wafers" Technical Disclosure Bulletin, vol. 32, No. 1 dated Jun. 1989.

*Primary Examiner*—Parviz Hassanzadeh
*Assistant Examiner*—Karla Moore
(74) *Attorney, Agent, or Firm*—R W Becker & Associates; R W Becker

(57) ABSTRACT

To achieve a uniform coating of a substrate, with an apparatus and a method for coating substrates, according to which the substrate is supported on a substrate holder in such a way that a substrate surface that is to be coated is exposed, and the substrate is rotated together with the substrate holder, a cover can be secured to the substrate holder and together with the substrate holder forms a sealed chamber for the substrate.

25 Claims, 3 Drawing Sheets

U.S. PATENT DOCUMENTS

| | | | | |
|---|---|---|---|---|
| 5,980,706 A | * | 11/1999 | Bleck et al. | 204/297.14 |
| 6,004,622 A | * | 12/1999 | Yen et al. | 427/240 |
| 6,027,602 A | * | 2/2000 | Hung et al. | 156/345 |
| 6,033,135 A | * | 3/2000 | An et al. | 396/611 |
| 6,120,834 A | * | 9/2000 | Terauchi | 427/96 |
| 6,156,125 A | * | 12/2000 | Harada | 118/733 |
| 6,220,771 B1 | * | 4/2001 | Tung et al. | 396/611 |
| 6,419,751 B1 | * | 7/2002 | Nagashima | 118/715 |

\* cited by examiner

METHOD AND APPARATUS FOR TREATING SUBSTRATES

This application is a 371 of PCT/EP00/00380 filed Jan. 19, 2000.

BACKGROUND OF THE INVENTION

The present invention relates to a method and an apparatus for coating substrates, according to which the substrate is held on a substrate holder in such a way that the substrate surface that is to be coated is exposed, and the substrate is rotated together with the substrate holder.

An apparatus of this type is known, for example, from EP-A 0 711 108. This apparatus includes an initial coating station, whereby a downwardly directed substrate surface that is to be coated is moved past a capillary gap that is supplied with lacquer to coat the substrate surface. The substrate is subsequently moved to a centrifuging station and is rotated or centrifuged within a protective ring that serves to convey away residual lacquer that is centrifuged from the substrate.

DE-A-195 45 573 discloses an apparatus for the uniform application of a lacquer layer to a substrate, according to which a substrate is placed upon a rotary plate with the side that is to be coated facing upwardly. During a centrifuging process, a hood that at least partially covers the substrate is moved from above over the substrate and is slightly spaced therefrom, or is positioned directly upon the substrate.

DE-A-92 18 974 also discloses an apparatus for applying a thin layer, for example of lacquer, upon a substrate by means of a centrifuging device. The apparatus includes a rotary plate upon which a substrate that is to be coated is disposed with the surface that is to be coated facing upwardly. A hood can be positioned from above upon the rotary plate in order to form a chamber for receiving a substrate. In this connection, the chamber formed between the hood and the rotary plate is connected to the surrounding atmosphere by means of apertures in the rotary plate. Furthermore, elastic cover strips are provided on the hood and are in contact with upwardly directed edges of the substrate to form a chamber between the cover and the substrate.

U.S. Pat. No. 5,042,421 discloses a rotary head arrangement for coating a semiconductor, and includes a rotary plate for supporting the wafer and a disk that surrounds the wafer and can be secured to the rotary plate.

DE-A40 24 642 furthermore shows a rotary plate for receiving a substrate, which is held on the rotary plate by means of a vacuum.

These apparatus have the problem that the uniformity of the layer thickness achieved by the centrifuging process is not always adequate.

It is therefore an object of the present invention to provide a method and apparatus of the aforementioned type for treating substrates according to which a homogeneous coating of the substrate surface that is to be treated is achieved.

SUMMARY OF THE INVENTION

The stated object is realized pursuant to the present invention in that a cover, which can be secured to the substrate holder, together with the substrate holder forms a sealed chamber that receives the substrate. By means of the cover that can be secured to the substrate holder, defined environmental conditions are achieved for the substrate between the substrate holder and the cover. In particular, a static region is formed in such a way within the chamber that the gases disposed therein, for example air, turn together with the substrate holder and the cover secured thereto. Furthermore, the distance between that side of the cover that faces the substrate is kept at a constant value during the rotation process. As a result, relative movements and turbulences between the substrate and gases disposed in the chamber are reduced to a minimum, which leads to a very homogeneous coating of the substrate. In this connection, it is immaterial whether the entire surface that is to be coated is pre-coated, or if only a partial region, such as a central portion of the substrate surface, is pre-coated, and the complete coating is effected by means of the rotation process. The defined environmental conditions for the substrate furthermore permit a more uniform and gradual drying of a solvent contained in the coating. Since the surface that is to be coated is held in a downwardly directed position, there is furthermore ensured that coating medium dislodged from the substrate does not come into contact with side edges or the backside of the substrate.

To ensure a good hold of the substrate on the substrate holder, without adversely affecting the substrate surface that is to be coated, the substrate holder has a holding mechanism for holding the substrate with vacuum.

Pursuant to one preferred specific embodiment of the present invention, the substrate holder is furthermore provided with a holding mechanism for holding the cover with vacuum. The holding mechanisms for the substrate and the cover are advantageously connected to a common vacuum supply in order to have to provide only a single vacuum source, such as a vacuum pump. In this connection, the holding mechanisms for the substrate and the cover can preferably be controlled independently of one another, for example by a valve unit, since the cover is secured to the substrate holder only for the rotation or centrifuging process, whereas the substrate is held on the substrate holder over longer time periods, especially also during a pre-coating process.

In order to achieve a well defined vacuum region between the substrate holder and the cover, and to thus achieve a good hold, a seal is provided between the substrate holder and the cover.

Pursuant to one specific embodiment of the present invention, a recess is provided in the substrate holder for the at least partial accommodation of the substrate; by means of this recess, a centering of the substrate relative to the holder can be achieved. Furthermore, the recess can offer lateral support for the substrate during the rotation or centrifuging process.

The apparatus is preferably provided with a centering means for the mutual centering of the cover and of the substrate holder in order to ensure a defined position of the cover relative to the substrate holder as well as to the substrate. For an economical and simple centering, the centering means is preferably provided with at least one slanted centering portion on the cover and/or on the substrate holder. In order to prevent an imbalance and a lateral shifting of the cover relative to the substrate holder during the rotation thereof, the cover is preferably symmetrical relative to a central axis.

Pursuant to one particularly preferred embodiment of the present invention, to form adequate space for the residual centrifuged-off lacquer, a notch is provided in the outer region of that portion of the cover that defines the chamber. Forming the notch in the outer region ensures that the residual lacquer, due to the centrifugal forces resulting during the rotation, is reliably conveyed away from the region of the substrate and also of the substrate holder in order to protect against contamination. In this connection the notch is preferably tapered outwardly in such a way that the side that faces the substrate holder is inclined. This further improves the conveyance of the lacquer from the substrate and from the substrate holder.

Pursuant to a further particularly preferred specific embodiment of the present invention, the cover is symmetrical relative to its horizontal central plane, and a device for turning the cover is provided so that the cover can be placed into a first position and into a position rotated by about 180°. A receiver, which can be adjustable in height, is preferably provided for supporting the cover in order to su port the cover between the rotation processes, when the cover is secured to the substrate holder. To permit cleaning of the cover during or between the respective centrifuging processes, a rinsing and/or drying device is provided for the cover. The rinsing and/or drying prevents contamination of the substrate that is to be treated subsequently with such contamination adhering to the cover. Pursuant to a particularly advantageous specific embodiment of the present invention, the rinsing and/or drying device is part of the receiver, and has at least one nozzle that is directed against the cover and/or the notch. Directing a nozzle against the notch is particularly advantageous since, as indicated above, lacquer residue preferably collects in these notches and would fill these notches over time if they were not cleaned. At least one nozzle can preferably be supplied with a rinsing fluid that contains solvent in order to remove the lacquer residue. After the rinsing, a drying fluid is preferably directed against the cover via the same or a further nozzle in order to dry the cover.

The object of the present invention is also realized by a method for treating substrates, according to which the substrate is held on a substrate holder in such a way that the substrate surface that is to be treated is exposed and is directed downwardly, and the substrate is rotated with the substrate holder, wherein a cover is secured to the substrate holder and together with the substrate holder forms a sealed chamber for the substrate. By securing the cover to the substrate holder, and by forming the sealed chamber, the aforementioned advantages are achieved.

Pursuant to one particularly advantageous specific embodiment of the present invention, that side of the cover that faces away from the substrate is rinsed and/or dried during the rotation process. Due to the simultaneous rinsing and/or drying with the rotation process, time is saved since the rinsing and/or drying does not have to be carried out in an intermediate step. Furthermore, the centrifugal forces resulting from the rotation process enhance the rinsing and/or drying.

The cover is preferably turned between successive rotation processes so that a clean side of the cover is always directed to the substrate that is to be treated, whereas the side that has become contaminated from the previous rotation process faces away from the substrate and can be cleaned.

The present invention is particularly suitable for the thin layer industry, especially for the manufacture of LCD image screens, masks for the manufacture of semiconductors, semiconductor or ceramic substrates, in order to provide right-angled or round plates with a uniform layer of lacquer or another initially liquid medium, such as color filters or special protective layers.

BRIEF DESCRIPTION OF THE DRAWING

The present invention will subsequently be explained with the aid of preferred specific embodiments in conjunction with reference to the drawings; in the drawings.

DESCRIPTION OF PREFERRED EMBODIMENTS

Figure 1:
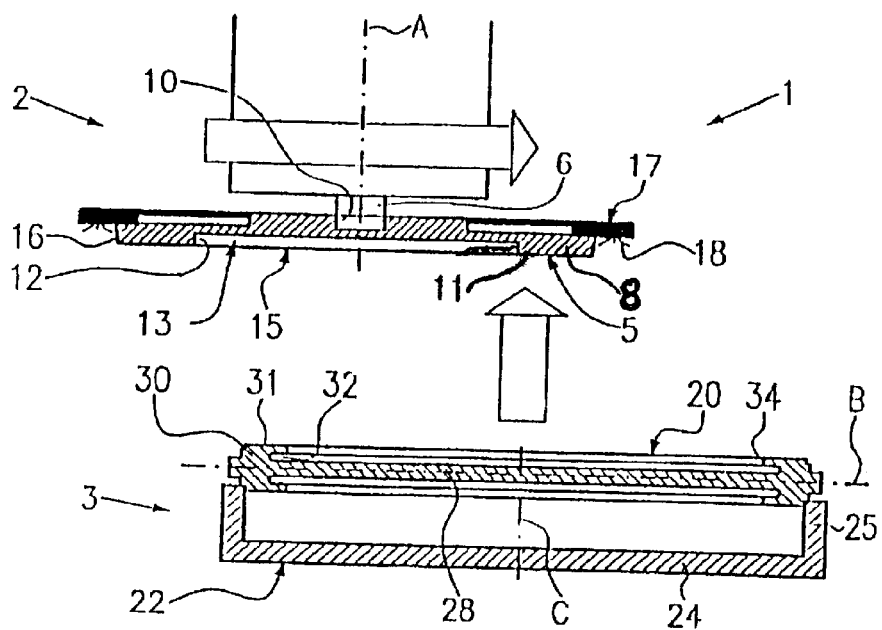
FIG. 1 is a schematic illustration of the inventive apparatus, according to which a substrate holder that carries a substrate, and a cover, are spaced from one another.

FIGS. 1–6 show an operating sequence for the inventive coating apparatus 1. The apparatus 1 essentially comprises a substrate receiving and transporting unit 2 and a cover unit 3.

The receiving and transporting unit 2 is provided with a transport device, which is not shown in detail, and a substrate holder 5, which by means of a rotary shaft 6 is coupled with a rotation device, which is not illustrated in detail. The rotation device is connected to the transporting device and is movable therewith. A receiving and transporting unit of this type, having a transporting device, a rotation device and a substrate holder, is known, for example, from the previously mentioned EP-A-0 711 108, which to that extent is hereby incorporated by reference to avoid repetition.

The substrate holder 5 comprises a base plate 8 which, on the upper side thereof that faces the transport device, is provided with a recess 10 for the appropriate accommodation of the rotary shaft 6. The substrate holder 5 is rotationally symmetrical relative to an axis of rotation A of the rotary shaft 6. A recess 12 for receiving a substrate 13 is formed in the underside 11 of the base plate 8, which underside faces away from the transport device. The substrate 13 is accommodated in the recess 12 in such a way that a surface 15 of the substrate that is to be coated faces away from the substrate holder and is exposed. The depth of the recess 12 corresponds to the thickness of the substrate that is to be accommodated, so that the underside 11 of the base plate 8 is flush with the surface 15 of the substrate that is to be coated when the substrate 13 is inserted into the recess. However, if desired, the surface 15 can also be spaced from the plane defined by the underside 11 of the base plate 8, and in particular can project downwardly beyond the underside 11. The substrate 13 is held on the substrate holder 15 by non-illustrated vacuum openings that are formed in the base plate and communicate with a non-illustrated source of vacuum, such as a vacuum pump.

The base plate 8 is provided with a slightly conical, downwardly tapering outer periphery 16 which, as will be described subsequently, serves as a slanted centering portion.

In addition to the vacuum openings for holding the substrate 13, the substrate holder 5 is provided with a further vacuum holding device 17 having cup-shaped vacuum grippers 18 that communicate with a vacuum source via non-illustrated lines. This vacuum source is the same as that with which the vacuum openings for holding the substrate 13 communicate. However, by means of valves the vacuum grippers 18 can be supplied with a vacuum independently from the vacuum openings for holding the substrate 13. The vacuum grippers 18 are disposed radially adjacent the base plate 8 of the substrate holder 5, and are recessed relative to the underside 11. Although only two vacuum grippers 18 are illustrated in FIG. 1, it should be noted that a plurality of vacuum grippers 18 are rotationally symmetrically provided about the periphery of the substrate holder 5. Instead of using a common source of vacuum for the vacuum grippers 18 and the vacuum openings for the substrate, it would also be possible to use two separate vacuum sources.

The cover unit 3 essentially comprises a cover element, to be called a cover 20, and a receiving element, i.e. a receiver 22, for accommodating the cover. As shown in FIG. 1, the receiver 22 has a basin-shaped cross-sectional configuration with a base plate 24 and a side wall 25 that extends perpendicular thereto.

The cover 20 has a central wall 28 with a horizontal central plane B. The cover 20 is symmetrical relative to the horizontal central plane B, so that only the upper portion of the cover will be described. A flange 30 extends upwardly from the central wall 28 rotationally symmetrical relative to a central axis C of the cover 20. The flange 30 forms a planar surface 31 that, as will be described subsequently, is brought into contact with the vacuum grippers in order to produce a connection therebetween. Adjacent to the central wall 28, the flange 30 is provided with a notch 32 that is rotationally symmetrical relative to the central axis C. The notch 32 is formed flush with the central wall 28. By means of the notch 32, a rotationally symmetrical radially extending projection 34, which is disposed above the notch 32, is formed on the flange 30; the projection forms a portion of the planar surface 31. The inner periphery of the projection 34 conforms to the outer periphery of the base plate 8, so that the base plate 8 can be accommodated between the projection 34 of the flange 30, whereby the tapering outer periphery effects a centering between the substrate holder 5 and the cover 20.

When the base plate 8 of the substrate holder 5 is accommodated in the cover, the vacuum grippers 18 come into engagement with the planar surface 31 of the flange 30. In this position, a chamber 36 is formed between the substrate holder 5 and the cover 20, as illustrated, for example, in FIG. 2. In this position, vacuum is applied to the vacuum grippers 18, so that the cover 20 is securely held on the substrate holder 5.

Figure 3:
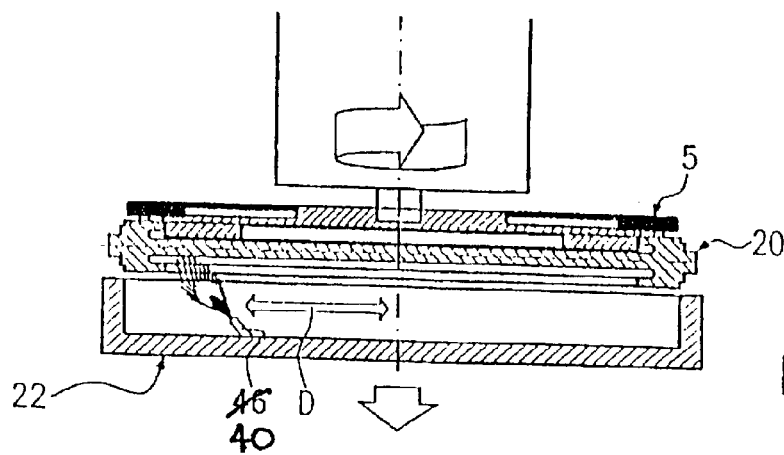
FIG. 3 is a further schematic illustration of the inventive apparatus of FIG. 1, whereby the cover is secured to the substrate holder and rotates therewith.

As shown in FIG. 3, provided within the receiver 22 is a nozzle 40 that is directed against the underside of the cover 20, especially against the recess thereof; by means of the nozzle a rinsing and/or drying fluid is sprayed against the underside of the cover 20. The nozzle 40 is movable within the receiver 22, as indicated by the arrow D. Instead of the single nozzle, a plurality of nozzles can also be provided.

Figure 5:
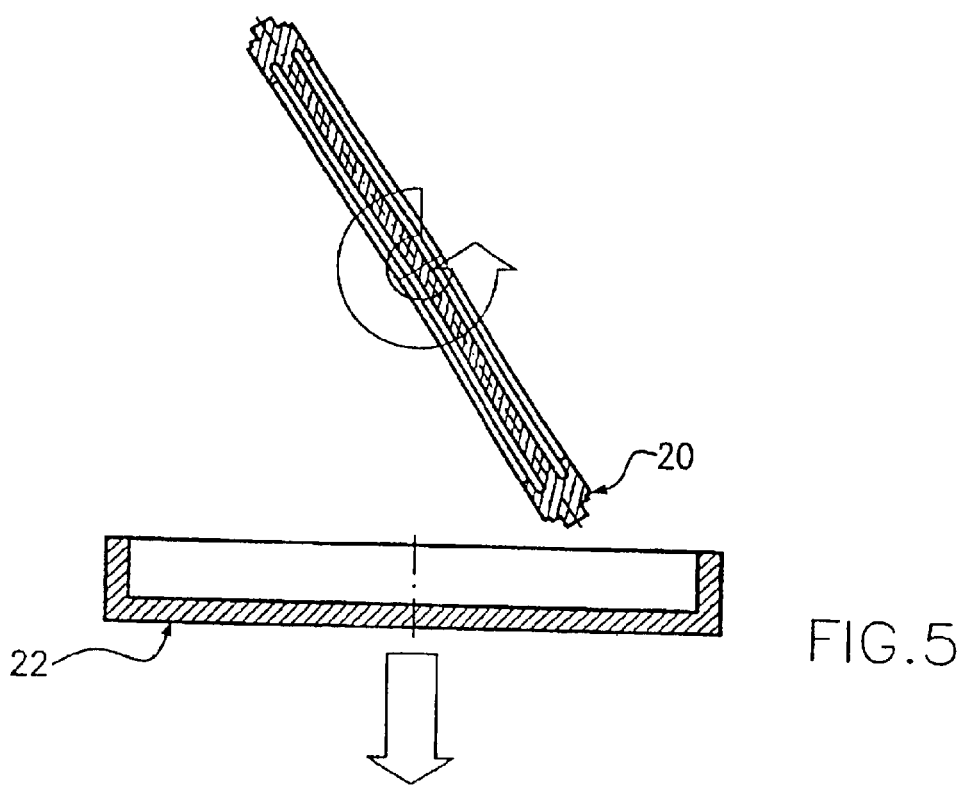
FIG. 5 is a schematic illustration of the inventive cover and a receiver for the cover, whereby the cover is shown during a turning process.

The cover unit 3 is furthermore provided with a non-illustrated turning device for turning the cover 20 about the central plane B, as illustrated in FIG. 5.

Figure 6:
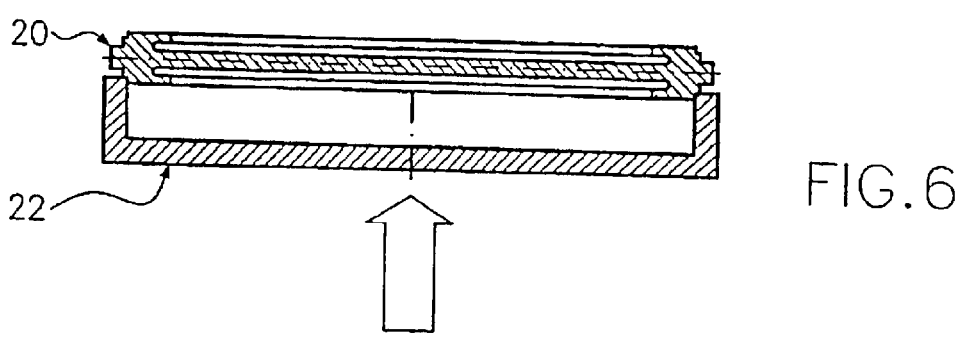
FIG. 6 is a schematic illustration of the cover and the receiver, according to which the cover is placed upon the receiver.
Figure 7:
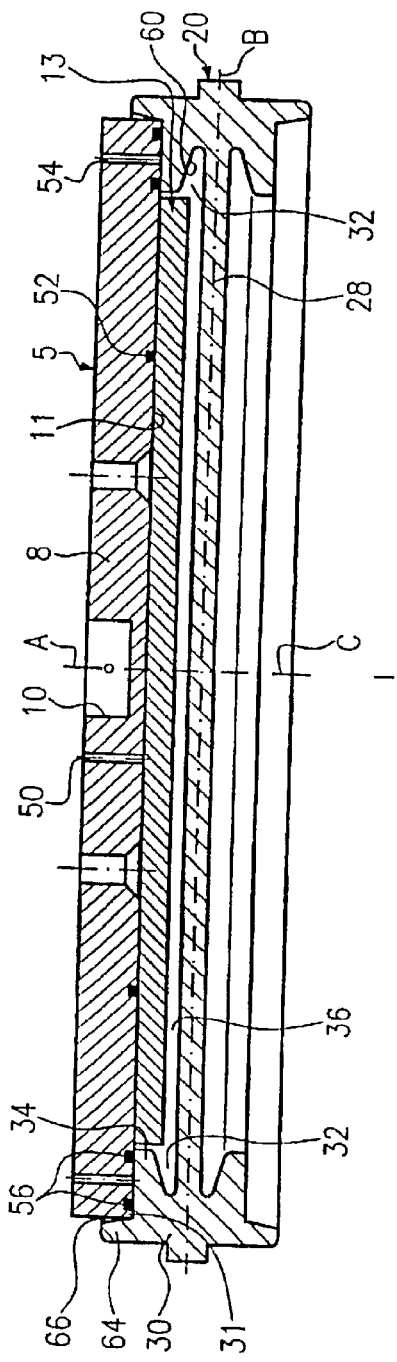
FIG. 7 is an enlarged schematic cross-sectional illustration of a further exemplary embodiment of the present invention, and shows the substrate holder in the cover.
Figure 8:
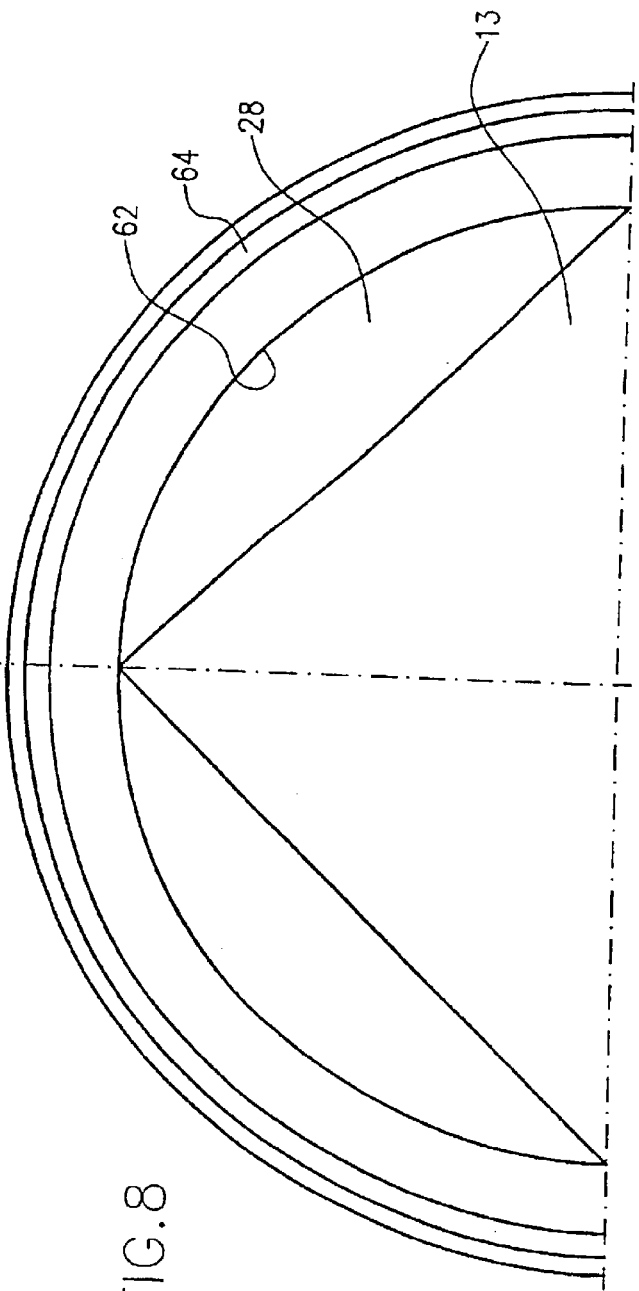
FIG. 8 is a top view of the inventive cover of FIG. 7.

FIGS. 7 and 8 illustrate an alternative embodiment of the substrate holder 5 with an alternative embodiment of the cover 20. The same reference numerals are used in FIGS. 7 and 8 as in FIGS. 1–6 for the same or similar elements.

The substrate holder 5 again has a base plate 8, which on its upper side is provided with a recess 10 for receiving a rotary shaft. In contrast to the embodiment of FIGS. 1–6, the underside 11 of the main body 8 that faces the substrate is not provided with a recess for accommodating the substrate 13. The main body 8 is flat, and the substrate 13 is held against the base plate 8 via vacuum openings 50 in the main body 11. As was the case with the first embodiment of FIGS. 1–6, the vacuum openings 50 are in contact with a vacuum source. Formed in the underside 11 of the main body 8 is a groove that surrounds the vacuum openings 50 for receiving a sealing element, such as an O-ring 52.

Vacuum openings 54 are formed in the outer portion of the base body 8 of the substrate holder 5; these vacuum openings communicate with a vacuum source and replace the vacuum grippers 18 of FIGS. 1–6. Although only two vacuum openings 54 are illustrated in FIG. 7 it should be noted that a plurality of vacuum openings 54 are rotationally symmetrically provided relative to the axis of rotation A of the substrate holder 5. Provided in the underside 11, adjacent to the vacuum openings 54, are two circumferential grooves for receiving sealing elements 56, such as O-rings.

The cover 20 is again provided with a central wall 28 having a central plane B to which the upper and lower sides of the cover 20 are symmetrical. Therefore, again only the upper portion of the cover 20 will be described. A circumferential flange 30 having a planar upper surface 31 again extends upwardly in the outer region of the central wall 28. The flange is rotationally symmetrical relative to the central axis C, which pursuant to FIG. 7 coincides with the axis of rotation A of the substrate holder 5. The flange 30 is again provided with a notch 32 that is adjacent to and flush with the central wall. By means of the notch 32, an inwardly extending projection 34 of the flange 30 is formed. The inner periphery 62 of the projection is dimensioned such that a substrate 13 that is to be coated can be received within or between the projection without contacting the same. The notch 32 has an inclined upper side 60, so that the notch 32 is tapered radially outwardly.

The flange 30 has a further projection 64 that extends axially from the planar upper surface 31 and defines a downwardly tapering inner peripheral surface 66. The downwardly tapering inner peripheral surface 66 is adapted to the outer peripheral shape of the substrate holder 5 and forms a slanted centering portion, so that the main body 8 can slide along the inner peripheral surface 66 until the underside 11 of the main body 8 of the substrate holder 5 rests upon the planar upper surface 31 of the flange 30 of the cover 20. By means of the tapering inner circumferential shape, a centering of the substrate holder 5 relative to the cover 20, and hence a centering of the substrate 13 relative to the substrate holder 5, is ensured.

Although pursuant to FIG. 7 sealing means 56 are provided in the base body 8, these could be formed in the same manner in recesses provided in the planar upper surface 31 of the cover 20.

FIG. 8, which is a top view of the cover 20, clarifies, in addition to the circular shape, also the position of the planar upper surface 31 of the flange 30 that forms the vacuum region that ensures the adhesion or bonding of the cover to the substrate holder. Due to its position, contamination of this region is nearly precluded.

An operating sequence of the inventive coating process will now be described with the aid of FIGS. 1–6, whereby the same sequence is applicable for the elements of FIG. 7.

In FIG. 1, the substrate receiving and transporting unit is moved over the cover unit 3, which is raised in the direction of the substrate receiving and transporting unit by means of a non-illustrated lifting device, as indicated by the respective arrows. At this point in time, the substrate surface 15 is pre-coated, for example by means of a cap coating process, as described in the aforementioned EP-A-0 711 108. By means of the cap coating process, for example a uniform coating in a thickness range of 1 µm to 2 µm is applied to the substrate surface that is to be coated.

Figure 2:
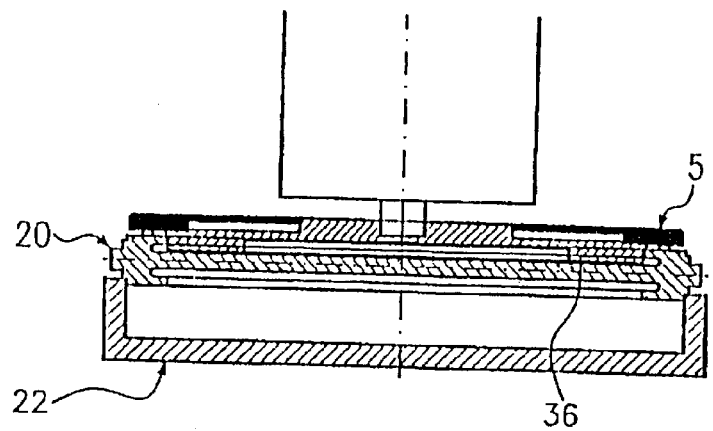
FIG. 2 is a further schematic illustration of the inventive apparatus, whereby the cover is in contact with the substrate holder

The substrate holder 5 is brought into contact with the cover 20 as shown in FIG. 2, and by means of the slanted centering portion 16 on the substrate holder, or the slanted centering portion 66 on the cover, the substrate holder is centered, so that the axis of rotation A of the substrate holder, and the central axis C of the cover, coincide. The cover 20 is then drawn against and securely held against the substrate holder 5 by vacuum, either via the vacuum grippers 18 or the vacuum openings 54. As a result, a hermetically sealed chamber 36 is formed between the substrate holder 5 and the cover 20, as best seen in FIG. 7.

Subsequently, as shown in FIG. 3, the receiver 22 is lowered slightly, so that the cover 20 is no longer in contact with the receiver 22. By means of the non-illustrated turning device, the substrate holder, together with the substrate 13 and the cover 20 secured thereto, are then rotated, whereby excess material is centrifuged from the preliminarily coated upper surface 15 of the substrate 13, with such excess material collecting within the notch 32 of the cover 20 due to the centrifugal force. Due to the fact that the substrate 13 is disposed in the hermetically sealed chamber 36 during the centrifuging process, a homogeneous coating of the substrate over the entire surface thereof is achieved, with deviations relative to the thicknesses of the coating being less than 1% for layer thickness' in the range of 0.2 µm to 1.0 µm. In particular, the uniformity of the coating is improved in the corner regions of right-angled substrates. There remains only a small rim portion of less that 2 mm in which the uniformity of the coating cannot be guaranteed.

At the same time, by means of the nozzle 40, a rinsing fluid, which contains a solvent, is sprayed against the underside of the cover 20 in order to clean the latter. The cleaning effect is thereby enhanced by the rotation of the cover 20. After the spraying of the rinsing fluid, a drying fluid is conveyed against the underside of the cover to dry the same.

Figure 4:
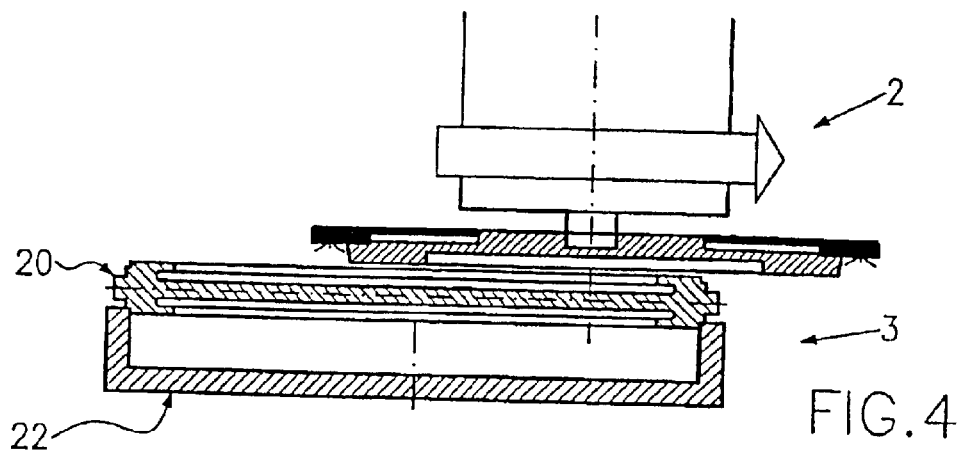
FIG. 4 is a further illustration of the inventive apparatus of FIG. 1, whereby the cover is again removed from the substrate holder and the substrate holder is moved away from the cover.

As shown in FIG. 4, after the centrifuging process the cover 20 is again placed upon the receiver 22, and the substrate receiving and transporting unit 2 is moved away from the region of the cover unit 3. As can be seen from FIG. 5, by means of a non-illustrated turning device the cover 20 is turned by 180° relative to the horizontal central plane while the receiver 22 is lowered in order to make the turning possible.

As shown in FIG. 6, after the turning process the receiver 22 is again raised and the cover 20 is placed upon the receiver 22. After the turning process, the previously cleaned side of the cover 20 faces upwardly, while the side that was contaminated by the preceding centrifuging process faces downward. The cover 20 is thus ready for use in a new centrifuging process.

As can be seen from the above description, the cover 20 does not have its own axis of rotation, i.e. it is not rotated itself by a separate turning device, but rather is passively rotated by the driven substrate holder. If the cover were to be actively rotated by its own turning device, a complicated adaptation and alignment of the thereby resulting two axes of rotation relative to one another would be necessary.

Although the present invention has been described in conjunction with preferred specific embodiments of the invention, it is to be understood that the present invention is not limited thereto. For example, for the centrifuging process, the cover 20 could also be secured to the substrate holder by electromagnets or by other means, such as a mechanical clamping device. In addition, cleaning of the cover is not necessary at the same time as the centrifuging process and could also be effected by means of a brush prior to or during the centrifuging process.

The specification incorporates by reference the disclosure of German priority document 199 06 398.2 of 16 Feb. 1999 and International priority document PCT/EP00/00380 of 19 Jan. 2000.

The present invention is, of course, in no way restricted to the specific disclosure of the specification and drawings, but also encompasses any modifications within the scope of the appended claims.

What is claimed is:

1. An apparatus for coating substrates, comprising:
   a substrate holder for holding thereon a substrate in such a way that a surface of said substrate that is to be coated is exposed and is directed downwardly;
   a cover that is securable to said substrate holder, such that the cover is freely rotatable therewith, wherein said cover, together with said substrate holder, are adapted to form a sealed chamber for receiving the substrate;
   a single means for rotating both said substrate holder and said cover; and
   a notch provided in an outer region of a portion of said cover that defines a chamber, wherein said notch tapers radially outwardly, and wherein said notch is inclined on a side thereof that faces said substrate holder.

2. An apparatus according to claim 1, wherein a holding mechanism is provided on said substrate holder for holding the substrate by means of vacuum.

3. An apparatus according to claim 2, wherein a holding mechanism is provided on said substrate holder for holding said cover by means of vacuum.

4. An apparatus according to claim 3, wherein said holding mechanisms for the substrate and for said cover are connected to a common vacuum source.

5. An apparatus according to claim 3, wherein said holding mechanisms for the substrate and for said cover are adapted to be controlled independently of one another.

6. An apparatus according to claim 3, wherein at least one sealing means is provided for delimiting a vacuum region between said substrate holder and said cover.

7. An apparatus according to claim 1, wherein said substrate holder is provided with a recess for an at least partial accommodation of the substrate.

8. An apparatus according to claim 1, wherein a centering mechanism is provided for a mutual centering of said cover and said substrate holder.

9. An apparatus according to claim 8, wherein said centering mechanism is in the form of at least one slanted centering portion on at least one of said substrate holder and said cover.

10. An apparatus according to claim 1, wherein said cover is symmetrical relative to a central axis C thereof.

11. An apparatus according to claim 10, wherein said cover is symmetrical relative to a central plane B thereof.

12. An apparatus according to claim 1, wherein a device is provided for turning said cover.

13. An apparatus according to claim 1, wherein a receiver is provided for supporting said cover.

14. An apparatus according to claim 13, wherein a device is provided for raising and lowering said receiver.

15. An apparatus according to claim 13, wherein a rinsing and/or drying device is provided for said cover.

16. An apparatus according to claim 15, wherein said rinsing and/or drying device is part of said receiver and is provided with at least one nozzle that is directed against at least one of said cover and said notch.

17. An apparatus according to claim 16, wherein at least one nozzle is adapted to be supplied with a rinsing and/or drying fluid.

18. An apparatus according to claim 17, wherein said rinsing fluid contains a solvent.

19. A method for coating substrates, including the steps of:

holding a substrate on a substrate holder in such a way that a surface of the substrate that is to be coated is exposed and is directed downwardly;

securing to said substrate holder a cover that together with said substrate holder forms a sealed chamber for receiving the substrate;

rotating, via a single means, the substrate together with said substrate holder and said cover conveying away from the region of the substrate and of the substrate holder residual material, due to centrifugal forces resulting during rotation of said substrate holder and said cover, into a notch provided in an outer region of a portion of said cover that defines a chamber, wherein said notch tapers radially outwardly, and wherein said notch is inclined on a side thereof that faces said substrate holder.

20. A method according to claim 19, wherein at least one of the substrate and said cover is held or secured on said substrate holder by means of vacuum.

21. A method according to claim 20, which includes the step of centering said cover and said substrate holder relative to one another prior to the holding or securement.

22. A method according to claim 19, wherein after said step of rotating the substrate, the securement of said cover is released independent of the holding of the substrate.

23. A method according to claim 19, wherein during said step of rotating the substrate a side of said cover that faces away from the substrate is rinsed and/or dried.

24. A method according to claim 19, wherein a rinsing or drying fluid is conveyed against said cover by means of at least one nozzle.

25. A method according to claim 19, which includes the step of turning said cover between successive ones of said rotating steps.

* * * * *